United States Patent
Yeh et al.

(10) Patent No.: US 10,453,746 B2
(45) Date of Patent: Oct. 22, 2019

(54) METHOD OF SEMICONDUCTOR INTEGRATED CIRCUIT FABRICATION

(71) Applicant: Taiwan Semiconductor Manufacturing Company, Ltd., Hsin-Chu (TW)

(72) Inventors: Ching-Fu Yeh, Hsinchu (TW); Chao-Hsien Peng, Zhubei (TW); Hsien-Chang Wu, Taichung (TW); Hsiang-Huan Lee, Jhudong Township, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/953,708

(22) Filed: Apr. 16, 2018

(65) Prior Publication Data

US 2018/0233406 A1 Aug. 16, 2018

Related U.S. Application Data

(63) Continuation of application No. 15/430,852, filed on Feb. 13, 2017, now Pat. No. 9,947,583, which is a
(Continued)

(51) Int. Cl.
*H01L 21/44* (2006.01)
*H01L 21/768* (2006.01)
(Continued)

(52) U.S. Cl.
CPC .... *H01L 21/76892* (2013.01); *H01L 21/0271* (2013.01); *H01L 21/0273* (2013.01);
(Continued)

(58) Field of Classification Search
CPC ......... H01L 21/76892; H01L 21/76838; H01L 21/02115; H01L 21/0271; H01L 21/0273;
(Continued)

(56) References Cited

U.S. PATENT DOCUMENTS

| 5,893,752 A | 4/1999 | Zhang et al. |
| 5,952,060 A | 9/1999 | Ravi |

(Continued)

FOREIGN PATENT DOCUMENTS

| CN | 102237390 | 11/2011 |
| TW | 200717657 | 5/2007 |
| TW | 201007928 | 2/2010 |

OTHER PUBLICATIONS

Applied Rolls CVD Technology for Sub-50nm Gates. Online Staff—Electronic News, Jun. 25, 2002. http://www.e-insite.net.
(Continued)

*Primary Examiner* — Tu-Tu V Ho
(74) *Attorney, Agent, or Firm* — Haynes and Boone, LLP

(57) ABSTRACT

A method of fabricating a semiconductor integrated circuit (IC) is disclosed. The method includes providing a substrate and depositing a conductive layer on the substrate. A patterned hard mask and a catalyst layer are formed on the conductive layer. The method further includes growing a plurality of carbon nanotubes (CNTs) from the catalyst layer and etching the conductive layer by using the CNTs and the patterned hard mask as an etching mask to form metal features.

20 Claims, 7 Drawing Sheets

Related U.S. Application Data continuation of application No. 14/733,487, filed on Jun. 8, 2015, now Pat. No. 9,570,347, which is a continuation of application No. 14/266,069, filed on Apr. 30, 2014, now Pat. No. 9,054,161, which is a continuation of application No. 13/724,342, filed on Dec. 21, 2012, now Pat. No. 8,735,280.

(51) Int. Cl.
 *H01L 21/02* (2006.01)
 *H01L 23/532* (2006.01)
 *H01L 21/027* (2006.01)
 *H01L 21/3213* (2006.01)
 *B82Y 40/00* (2011.01)

(52) U.S. Cl.
 CPC .. *H01L 21/02115* (2013.01); *H01L 21/02697* (2013.01); *H01L 21/32135* (2013.01); *H01L 21/32139* (2013.01); *H01L 21/76838* (2013.01); *H01L 21/76885* (2013.01); *H01L 21/76897* (2013.01); *H01L 23/53276* (2013.01); *B82Y 40/00* (2013.01); *H01L 2221/1094* (2013.01); *H01L 2924/0002* (2013.01); *Y10S 977/742* (2013.01)

(58) Field of Classification Search
 CPC ......... H01L 21/02697; H01L 21/32135; H01L 21/32139; H01L 23/53276; H01L 51/0045; H01L 51/0048; B82Y 40/00
 USPC ........................................................ 438/669
 See application file for complete search history.

(56) References Cited

U.S. PATENT DOCUMENTS

| | | | |
|---|---|---|---|
| 6,025,273 A | 2/2000 | Chen et al. | |
| 6,078,133 A | 6/2000 | Menu et al. | |
| 6,423,384 B1 | 7/2002 | Khazeni et al. | |
| 6,458,516 B1 | 10/2002 | Ye et al. | |
| 6,566,263 B1 | 5/2003 | Hung et al. | |
| 6,576,404 B2 | 6/2003 | Hu et al. | |
| 6,986,914 B2 | 1/2006 | Elers et al. | |
| 7,098,537 B2 | 8/2006 | Cabral, Jr. et al. | |
| 7,202,162 B2 | 4/2007 | Lin et al. | |
| 7,741,216 B2 | 6/2010 | Kim et al. | |
| 7,755,196 B2 | 7/2010 | Barth et al. | |
| 8,735,280 B1 | 5/2014 | Yeh et al. | |
| 9,054,161 B2 | 6/2015 | Yeh et al. | |
| 2002/0163079 A1 | 11/2002 | Awano | |
| 2003/0092280 A1 | 5/2003 | Lee et al. | |
| 2003/0124262 A1 | 7/2003 | Chen et al. | |
| 2005/0134161 A1 | 6/2005 | Kitamura | |
| 2005/0277292 A1 | 12/2005 | Peng et al. | |
| 2006/0128137 A1* | 6/2006 | Furukawa | B82Y 10/00 438/618 |
| 2007/0045724 A1 | 3/2007 | Lim et al. | |
| 2007/0148963 A1* | 6/2007 | Chan | H01L 21/76879 438/637 |
| 2008/0081464 A1 | 4/2008 | Matsuda et al. | |
| 2008/0111164 A1 | 5/2008 | Awano | |
| 2009/0045391 A1* | 2/2009 | Won | B82Y 10/00 257/9 |
| 2009/0271982 A1* | 11/2009 | Lee | H01L 21/76849 29/846 |
| 2010/0230815 A1 | 9/2010 | Tsao et al. | |
| 2011/0227224 A1 | 9/2011 | Kitao | |
| 2012/0097916 A1 | 4/2012 | Tada et al. | |
| 2012/0139115 A1 | 6/2012 | You et al. | |
| 2012/0269987 A1 | 10/2012 | Dordi et al. | |
| 2014/0235050 A1 | 8/2014 | Yeh et al. | |
| 2015/0235960 A1* | 8/2015 | Sato | H01L 23/53276 257/746 |
| 2015/0270170 A1 | 9/2015 | Yeh et al. | |
| 2017/0170066 A1 | 6/2017 | Yeh et al. | |

OTHER PUBLICATIONS

New Film Enables Gate Trimming Down to 40 nm. Aaron Hand, Managing Editor—Semiconductor International, Jul. 1, 2002. http://www.e-insite.net/semiconductor.

Applied's new CVD film technology enables sub-50-nm gates with current litho tools. Semiconductor Business News, Jun. 25, 2002. http://www.siliconstrategies.com.

\* cited by examiner

METHOD OF SEMICONDUCTOR INTEGRATED CIRCUIT FABRICATION

PRIORITY DATA

The present application is a continuation of U.S. application Ser. No. 15/430,852, filed Feb. 13, 2017, which is a continuation of U.S. application Ser. No. 14/733,487, filed Jun. 8, 2015, which is a continuation of U.S. application Ser. No. 14/266,069, filed Apr. 30, 2014, issued as U.S. Pat. No. 9,054,161, which is a continuation of U.S. application Ser. No. 13/724,342, filed Dec. 21, 2012, issued as U.S. Pat. No. 8,735,280, each of which is hereby incorporated by reference in its entirety.

BACKGROUND

The semiconductor integrated circuit (IC) industry has experienced exponential growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects of conductive lines and associated dielectric materials that facilitate wiring between the transistors and other devices play a more important role in IC performance improvement. Although existing methods of fabricating IC devices have been generally adequate for their intended purposes, they have not been entirely satisfactory in all respects. For example, challenges rise to develop a more flexible and a less complex process integration for interconnection formation. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
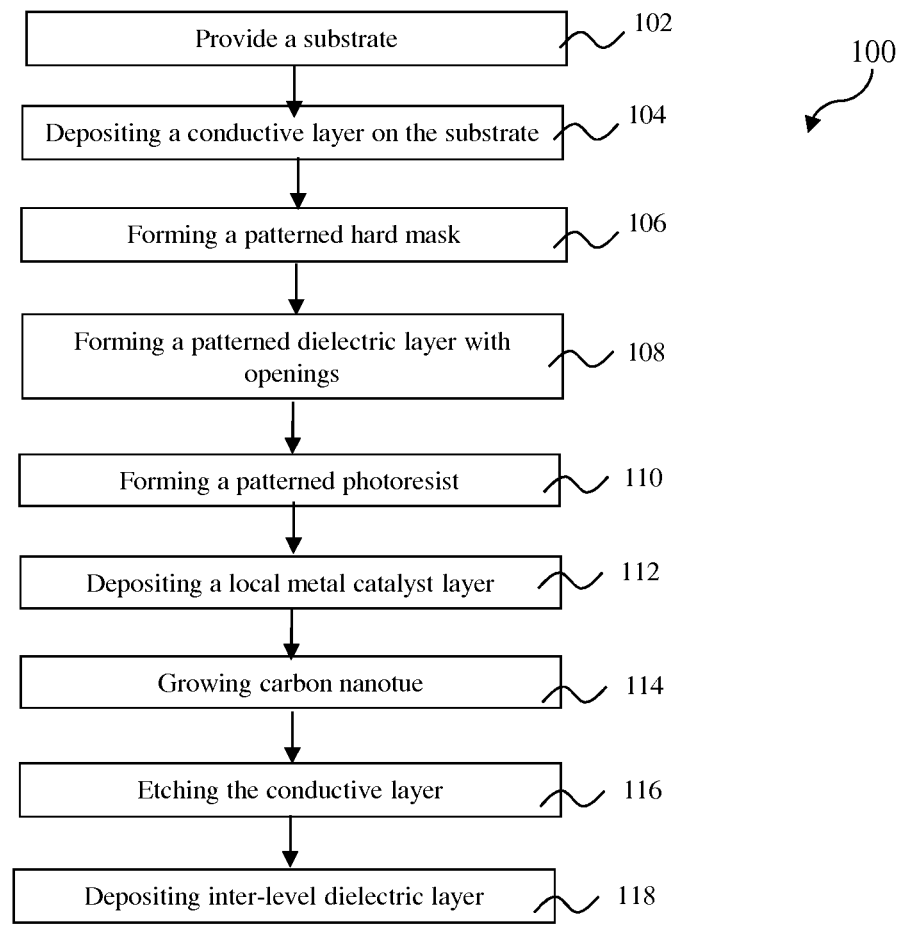
FIG. 1 is a flowchart of an example method for fabricating a semiconductor integrated circuit (IC) constructed according to various aspects of the present disclosure.

FIG. 1 is a flowchart of one embodiment of a method 100 of fabricating one or more semiconductor devices according to aspects of the present disclosure. The method 100 is discussed in detail below, with reference to a semiconductor device 200 shown in FIGS. 2 to 8 for the sake of example.

Figure 2:
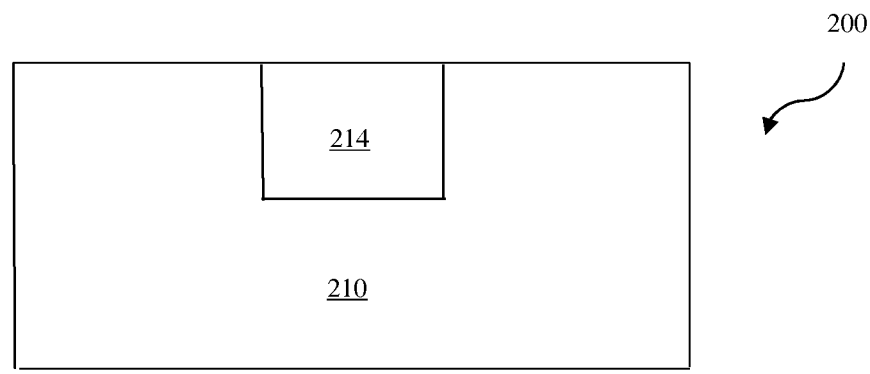
FIGS. 2 to 8 are cross-sectional views of an example semiconductor IC device at fabrication stages constructed according to the method of FIG. 1.

Referring also to FIG. 2, the method 100 begins at step 102 by providing a semiconductor substrate 210. The semiconductor substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The substrate 210 also includes conductive features 214. The conductive features 214 include a portion of the interconnect structure. For example, the conductive features 214 include contacts, metal vias, or metal lines. In one embodiment, the conductive features 214 are further surrounded by a barrier layer to prevent diffusion and/or provide material adhesion. The conductive feature 214 may include aluminum (Al), copper (Cu) or tungsten (W). The barrier layer may include titanium nitride (TiN), tantalum nitride (TaN), tungsten nitride (WN), titanium silicon nitride (TiSiN) or tantalum silicon nitride (TaSiN). The conductive features 214 (and the barrier layer) may be formed by a procedure including lithography, etching and deposition. In another embodiment, the conductive features 214 include electrodes, capacitors, resistors or a portion of a resistor. Alternatively, the conductive features 214 may include doped regions (such as sources or drains), or gate electrodes. In another example, the conductive features 214 are silicide features disposed on respective sources, drains or gate electrodes. The silicide feature may be formed by a self-aligned silicide (salicide) technique.

Figure 3:
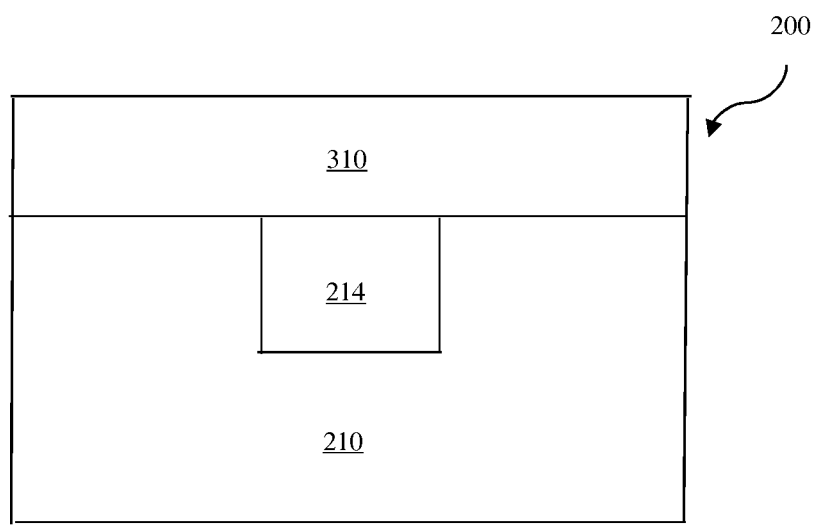

Referring to FIGS. 1 and 3, the method 100 proceeds to step 104 by depositing a conductive layer 310 on the substrate 210. The conductive layer 310 includes Al, Cu, W, or other suitable conductive materials. In one embodiment, the conductive layer 310 is Al. The conductive layer 310 may be deposited by PVD, CVD, or other suitable process.

Figure 4:
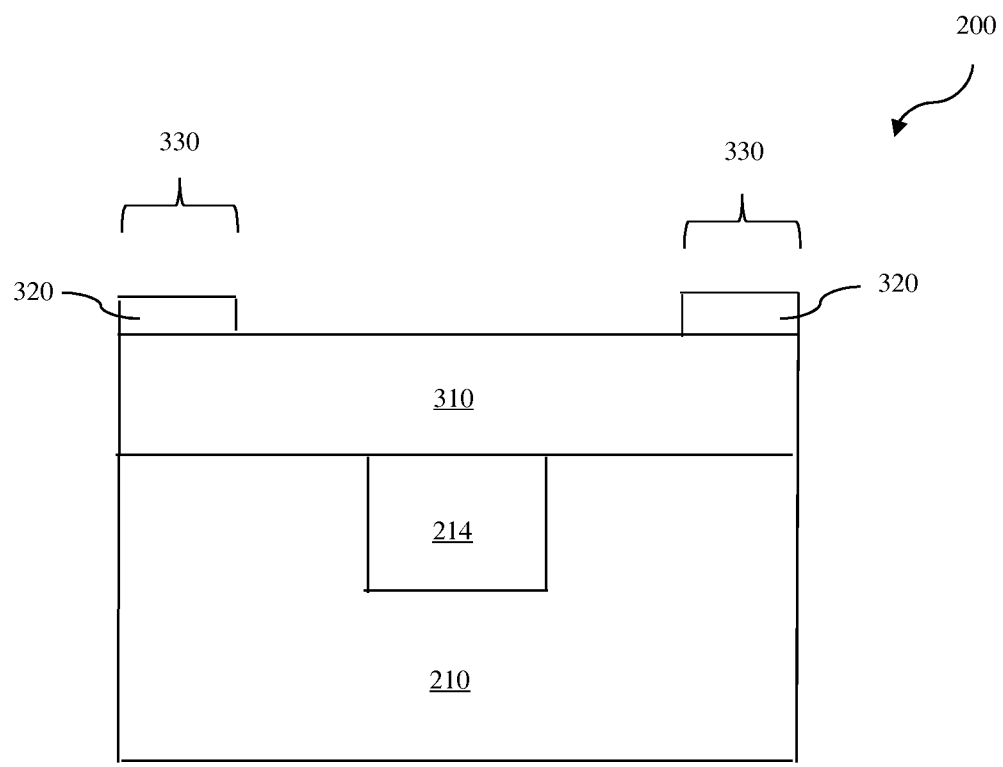

Referring to FIGS. 1 and 4, the method 100 proceeds to step 106 by formed a patterned hard mask 320 on the conductive layer 310. The patterned hard mask 320 includes a carbon film, such as graphite, charcoal and halocarbon polymer. The patterned hard mask 320 also includes nitride layer, e.g. titanium nitride (TiN), titanium silicon nitride (TiSiN), and spin-on-glass, e.g. SiO2, or other suitable material. The hard mask 320 may be deposited on the conductive layer 310 by PVD, CVD or spin-on process. The hard mask 320 is patterned by photolithography patterning and etching processes. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching). The patterned hard mask 320 is to protect a portion of the conductive layer 310, referred to as a horizontal interconnection region 330.

Figure 5:
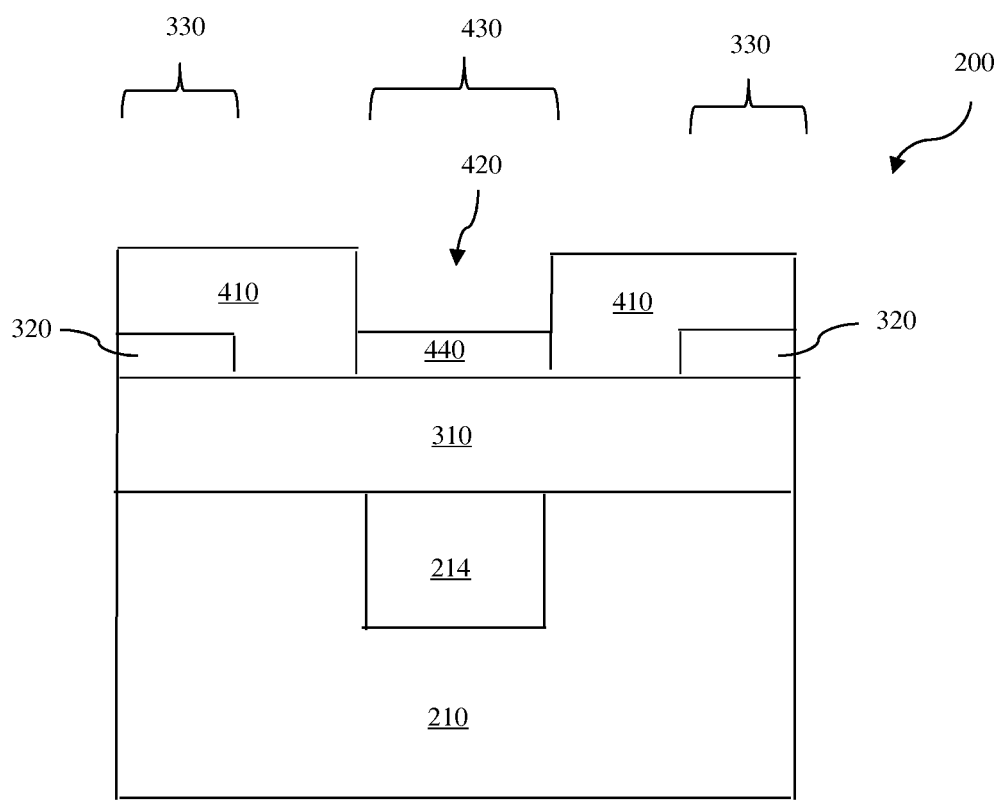

Referring to FIGS. 1 and 5, the method 100 proceeds to step 108 by forming a patterned photoresist 410 over the patterned hard mask 320 and the conductive layer 310. A photolithography patterning processes of the photoresist 410 is similar in many respects to what is discussed above in association with FIG. 4. The patterned photoresist 410 has openings 420 to at least partially exposing the conductive layer 310. The opening 420 is aligned to the respective conductive features 214 on the substrate 210 to define a vertical interconnection region 430.

Referring again to FIGS. 1 and 5, the method 100 proceeds to step 110 by depositing a local metal catalyst layer 440 in the openings 420. The local metal catalyst layer 440 includes iron (Fe), cobalt (Co), nickel (Ni), molybdenum (Mo), or combinations thereof. The local metal catalyst layer 440 may be selectively deposited on the conductive layer 310 in the opening 420 by CVD, ALD or other suitable processes.

Figure 6:
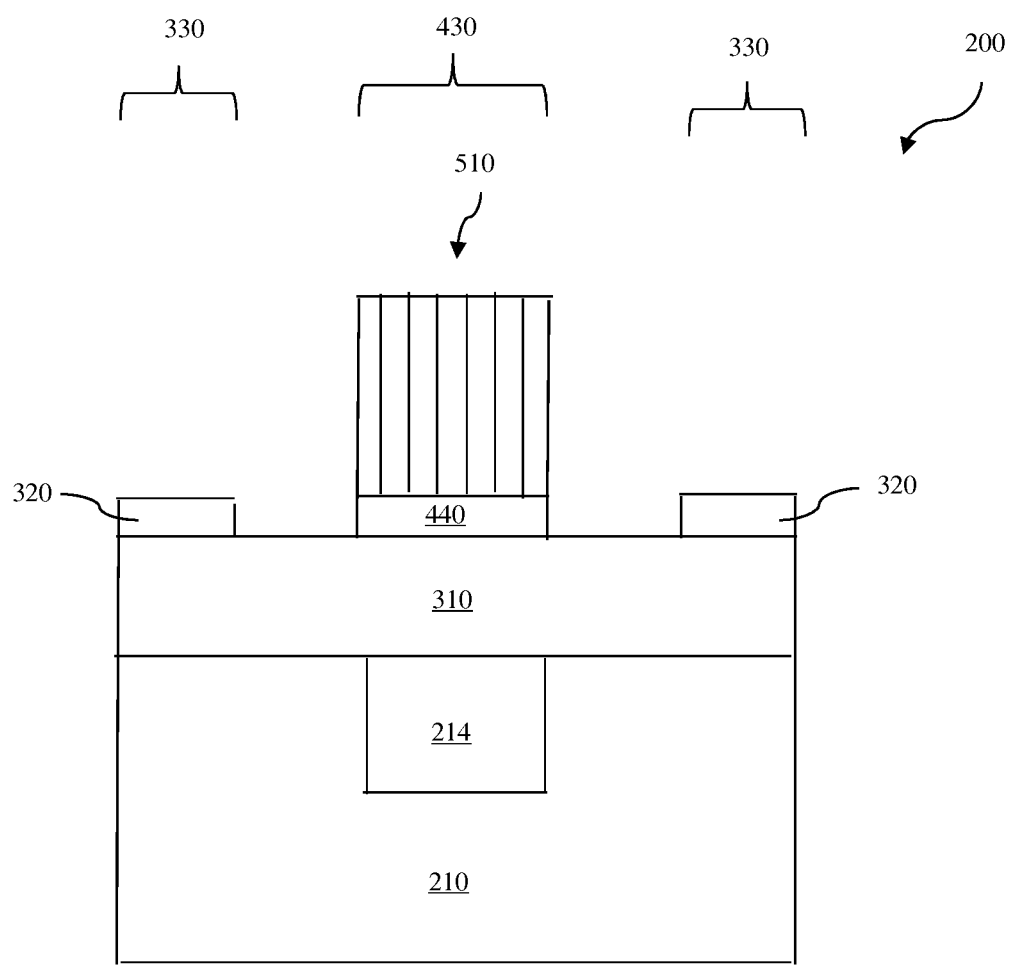

Referring to FIGS. 1 and 6, the method 100 proceeds to step 112 by growing carbon nanotubes (CNTs) 510 from the local metal catalyst layer 440. Prior to growing CNTs 510, the photoresist 410 is removed by a wet etch, a dry etch or a combination thereof. The CNTs 510 are allotropes of carbon with a cylindrical nanostructure. The CNTs 510 are grown selectively from the local metal catalyst layer 440 by processes such as CVD, arc discharge, laser ablation, or other suitable processes. For example, the CNTs 510 are grown by a CVD process where the substrate 210 (including the local metal catalysts layer 440) is heated up to about 700° C., process gases of ammonia, nitrogen or hydrogen are introduced to the local metal catalyst layer 440 and the CNTs 510 grow from the local metal catalyst layer 440.

Figure 7:
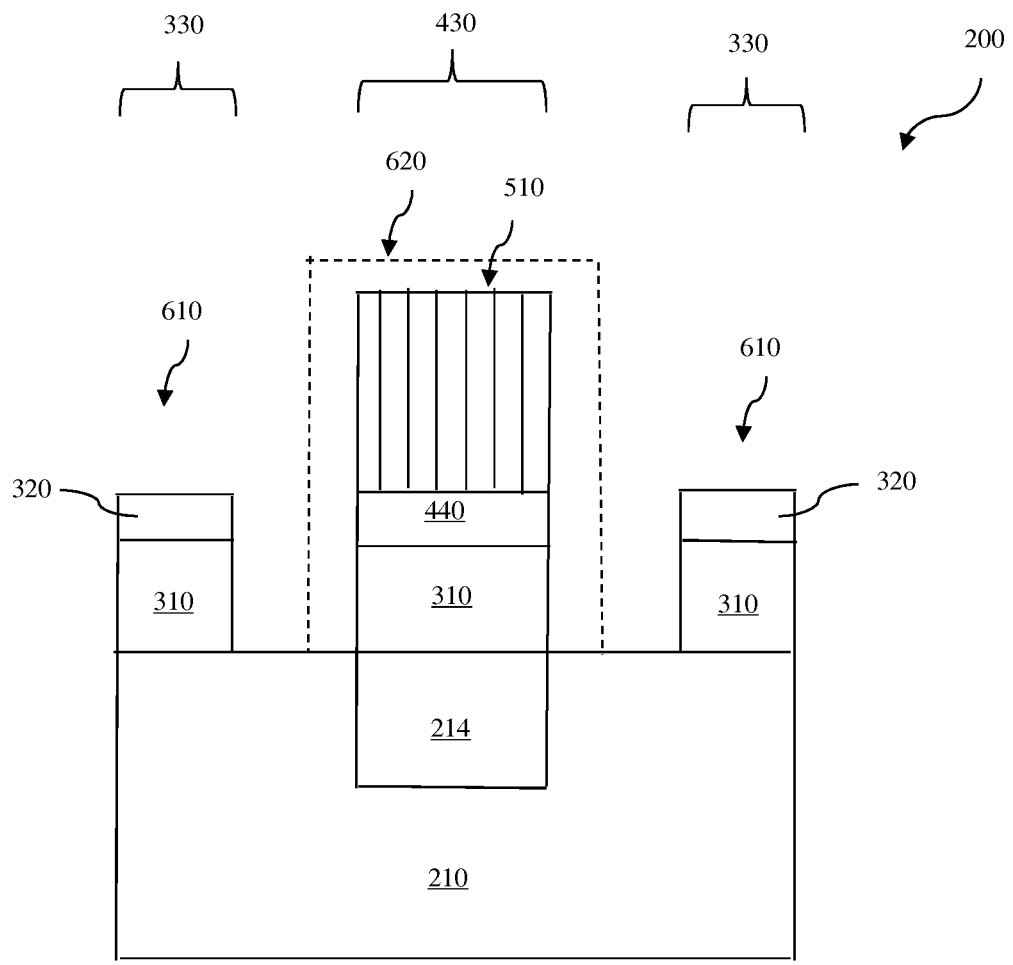

Referring to FIGS. 1 and 7, the method 100 proceeds to step 114 by etching the conductive layer 310 by using the patterned hard mask 320 and the CNTs 510 as etching masks. The conductive layer 310 may be etched by a dry etch process or other suitable etch processes. With etching masks of the patterned hard mask 320 and the CNTs 510, the conductive layer 310 is etched with a self-alignment nature to form a first metal feature 610 in the horizontal interconnection region 330 and a second metal feature 620 in the vertical interconnection region 430. The first metal feature 610 provides electrical connections among various device components in a same layer of the device 200. The second metal feature 620 provides electrical connections between various device components in different layers of the device 200.

Figure 8:
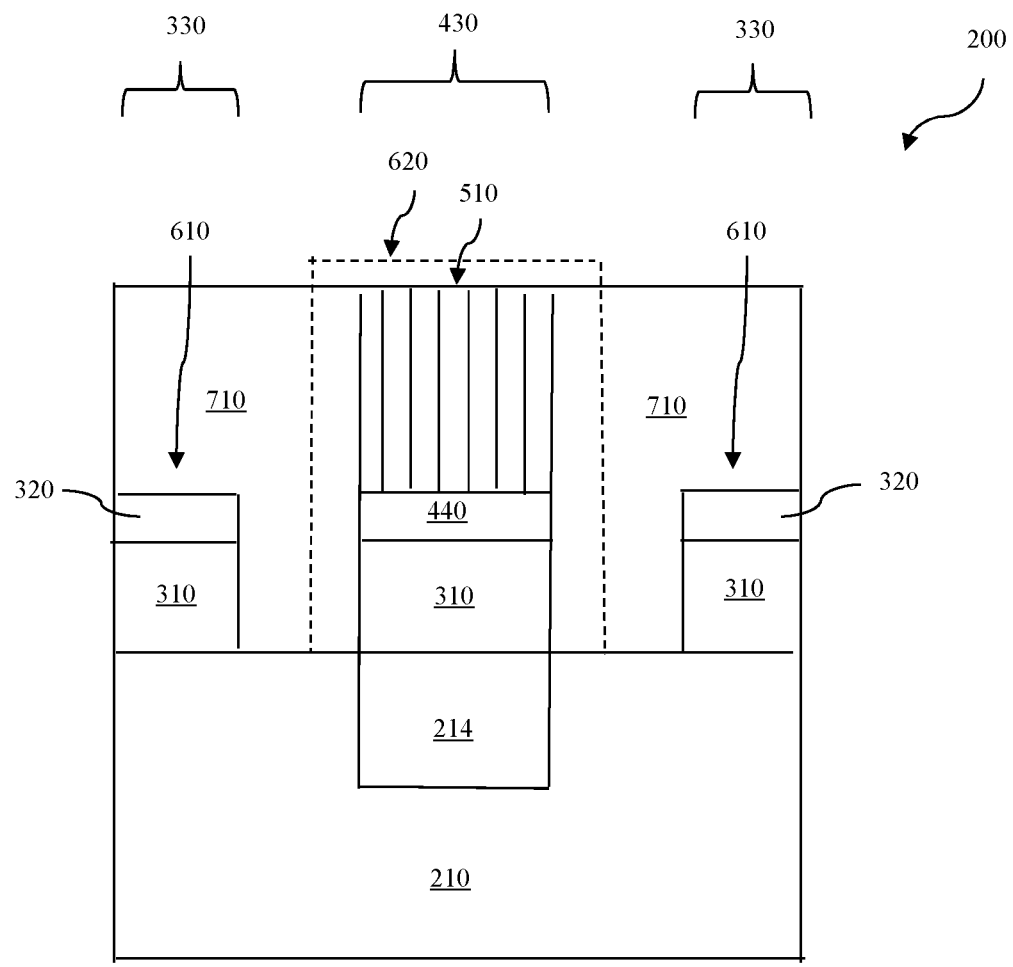

Referring to FIGS. 1 and 8, the method 100 proceeds to step 116 by depositing a dielectric material layer 710 to fill in regions between the first and second metal features 610 and 620. The dielectric material layer 710 includes dielectric materials, such as silicon oxide, silicon nitride, a dielectric material having a dielectric constant (k) lower than thermal silicon oxide (therefore referred to as low-k dielectric material layer), or other suitable dielectric material layer. In various examples, the low k dielectric material may include fluorinated silica glass (FSG), carbon doped silicon oxide, amorphous fluorinated carbon, Parylene, BCB (bis-benzocyclobutenes), SiLK (Dow Chemical, Midland, Mich.), polyimide, and/or other materials as examples. In another example, the low k dielectric material may include an extreme low k dielectric material (XLK). In yet another example, the low k dielectric material layer includes a porous version of an existing Dow Corning dielectric material called FOX (flowable oxide) which is based on hydrogen silsesquioxane. A process of forming the dielectric material layer 710 may utilize spin-on coating or CVD. In another embodiment, the dielectric material layer 710 is deposited by a spin-on dielectric (SOD) process to substantially fill in the regions between the metal features 610 and 620. In the present embodiment, the LK dielectric layer 710 is deposited to fill in the regions between the metal features 610 and 620. In one embodiment, the ILD layer 710 is deposited by CVD utilizing a fairly high temperature. During the high temperature deposition, a amount of carbon atoms of the carbon-containing hard mask 320 are dissolved into the Al layer of the first metal feature 610 to form Al—C alloy.

Additionally, a chemical mechanical polishing (CMP) process is performed to remove excessive dielectric layer 710 and expose top surface of the second metal feature 620. In one embodiment, steps 104 to 116 are repeated to form new metal/dielectric interconnections.

Additional steps can be provided before, during, and after the method 100, and some of the steps described can be replaced, eliminated, or moved around for additional embodiments of the method 100.

Based on the above, the present disclosure offers methods for fabricating IC device. The method employs utilizing a portion of a vertical interconnection metal feature, especially the CNTs, as an etching mask at an etching metal process. The method offers a simplified process flow to reduce process procedure in an interconnection formation. The method provides a self-alignment nature for a metal etching process in an interconnection formation. The method also provides a formation of a metal feature with Al—C alloy, which demonstrates device reliability performance enhancement.

The present disclosure provides many different embodiments of fabricating a semiconductor IC that provide one or more improvements over other existing approaches. In one embodiment, a method for fabricating a semiconductor integrated circuit (IC) includes providing a substrate, depositing a conductive layer on the substrate, forming a patterned hard mask on the conductive layer to define a horizontal interconnection region, forming a patterned photoresist on the conductive layer to define a vertical interconnection region, forming a local metal catalyst layer on the conductive layer in the vertical interconnection region, growing a carbon nanotubes (CNTs) from the local metal catalyst layer, etching the conductive layer by using the CNTs and the patterned hard mask as etching mask to form metal features and depositing an inter-level dielectric (ILD) layer between metal features on the substrate.

In another embodiment, a method for fabricating a semiconductor IC includes providing a substrate providing a substrate having a conductive feature, depositing a conductive layer on the substrate, depositing a carbon-containing hard mask on the conductive layer, patterning the carbon-containing hard mask to define a horizontal interconnection region on the conductive layer, coating a photoresist on the patterned carbon-containing hard mask and the conductive layer, patterning the photoresist to have openings to expose at least a portion of the conductive layer such that it aligns to a respective conductive feature on the substrate, depositing a local metal catalyst layer on the conductive layer in the photoresist opening. The method also includes after removing the patterned photoresist, growing a carbon nanotubes (CNTs) from the local metal catalyst layer. The method also includes etching the conductive layer by using the CNTs and the patterned hard mask as etching mask to form metal features in both horizontal and vertical interconnection regions and depositing an inter-level dielectric (ILD) layer between metal features on the substrate.

In yet another embodiment, a semiconductor IC includes a substrate a horizontal and a vertical interconnection regions on the substrate, a conductive feature on the substrate in the vertical interconnection region and a first metal feature in the horizontal interconnection region. The first metal feature includes an aluminum (Al) layer containing a substantial amount of aluminum-carbon (Al—C) alloy and a carbon-containing hard mask on top of the Al layer. The semiconductor IC also includes a second metal feature on top of the conductive feature in the vertical interconnection region on the substrate. The second metal feature includes an Al layer on top of the conductive feature, a local metal catalyst layer on top of the Al layer, a carbon-nanotube (CNT) on the local metal catalyst layer and an inter-level dielectric (ILD) layer between the first and the second metal features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a metal layer disposed over a substrate;
   a catalyst layer disposed on the metal layer, the catalyst layer having a first sidewall and an opposing second sidewall and a top surface extending from the first sidewall to the second sidewall;
   a plurality of carbon nanotubes (CNTs) disposed on the catalyst layer such that the plurality of CNTs extend continuously over the top surface of the catalyst layer from the first sidewall of the catalyst layer to the opposing second sidewall of the catalyst layer;
   a dielectric layer disposed adjacent to the plurality of CNTs; and
   a hard mask layer disposed over the substrate, and wherein the metal layer includes a first portion and a second portion, the catalyst layer extending from the first portion of the metal layer and the hard mask layer extending from the second portion of the metal layer.

2. The device of claim 1, wherein the substrate is a semiconductor substrate, and wherein the dielectric layer extends to the semiconductor substrate.

3. The device of claim 1, wherein the substrate includes a conductive feature, and wherein the metal layer physically contacts the conductive feature.

4. The device of claim 3, wherein the conductive feature includes a feature selected from the group consisting of a doped feature, a gate electrode, and a silicide feature.

5. The device of claim 1, wherein the hard mask layer includes a layer selected from the group consisting of a carbon film layer and a nitride layer.

6. The device of claim 1, wherein the dielectric layer extends continuously from the first portion of the metal layer to the second portion of the metal layer.

7. The device of claim 1, wherein the catalyst layer includes a material selected from the group consisting of iron (Fe), cobalt (Co), nickel (Ni), and molybdenum (Mo).

8. A device comprising:
a first conductive feature and second conductive feature disposed over a semiconductor substrate, the first conductive feature having a first width;
a catalyst layer disposed over the first conductive feature without being disposed over the second conductive feature;
a plurality of carbon nanotubes (CNTs) extending from the catalyst layer, the plurality of CNTs have the same first width as the first conductive feature; and
a dielectric layer extending from the second conductive feature to at least one carbon nanotube from the plurality of CNTs.

9. The device of claim 8, further comprising a third conductive feature disposed on a first side of the first conductive feature, wherein the second conductive feature is disposed on a second side of the first conductive feature, the second side being opposite the first side.

10. The device of claim 9, wherein the dielectric layer extends from the third conductive feature to at least one carbon nanotube from the plurality of CNTs.

11. The device of claim 8, further comprising a material layer disposed directly on a top surface of the second conductive feature, and wherein the dielectric layer is disposed over the second conductive feature, wherein the material layer prevents the dielectric layer from interfacing with top surface of the second conductive feature.

12. The device of claim 11, wherein the material layer includes a carbon film.

13. The device of claim 11, wherein the material layer includes a nitride layer.

14. The device of claim 8, wherein the first conductive feature has a first sidewall surface and the catalyst layer has a second sidewall surface that interfaces the first sidewall surface of the first conductive feature, and wherein the dielectric layer completely covers the first sidewall surface of the first conductive feature and the second sidewall surface of the catalyst layer.

15. A device comprising:
a conductive layer disposed over a substrate, wherein the conductive layer includes a first portion and a second portion that extend to the same height over the substrate;
a catalyst layer disposed on a top surface of the first portion of the conductive layer such that the catalyst layer physically contacts the top surface of the first portion of the conductive layer;
a plurality of carbon nanotubes (CNTs) extending from the catalyst layer;
a hard mask layer disposed on a top surface of the second portion of the conductive layer such that the hard mask layer physically contacts the top surface of the second portion of the conductive layer; and
a dielectric layer extending from the hard mask layer to at least one of the CNTs.

16. The device of claim 15, further comprising an interconnect structure disposed on the substrate, and wherein the conductive layer interfaces with the interconnect structure.

17. The device of claim 15, wherein the conductive layer has a sidewall surface and the dielectric layer is disposed directly on the sidewall surface of the conductive layer.

18. The device of claim 15, wherein the first portion and the second portion are spaced apart from each other by the dielectric layer.

19. The device of claim 18, wherein the top surface of the second portion is free of the catalyst layer.

20. The device of claim 15, wherein the dielectric layer physically contacts the conductive layer and the catalyst layer.

* * * * *